United States Patent [19]
Koblitz

[11] Patent Number: 5,204,589
[45] Date of Patent: Apr. 20, 1993

[54] DATA SIGNAL CONTROLLED OSCILLATOR FOR A VIDEO DISPLAY

[75] Inventor: Karl R. Koblitz, Meylan, France

[73] Assignee: Thomson Consumer Electronics, S.A., Courbovoie, France

[21] Appl. No.: 843,076

[22] Filed: Mar. 2, 1992

[51] Int. Cl.⁵ .......................... G09G 1/04; H01J 29/70
[52] U.S. Cl. ..................................... 315/364; 315/367
[58] Field of Search ............... 315/364, 367, 408, 370; 358/158; 331/20

[56] References Cited
U.S. PATENT DOCUMENTS

| | | | |
|---|---|---|---|
| 4,463,288 | 7/1984 | Judd | 315/371 |
| 4,803,407 | 2/1989 | Mehrgardt | 315/364 |
| 5,124,671 | 6/1992 | Srivastava | 331/10 |

OTHER PUBLICATIONS

An article entitled A New Video Processor for Color TV in the names of Yamamoto et al, dated 1988 and publ. by IEEE.

Primary Examiner—Gregory C. Issing
Attorney, Agent, or Firm—Joseph S. Tripoli; Joseph J. Laks; Sammy S. Henig

[57] ABSTRACT

The free-running frequency of a bus controlled horizontal oscillator is adjusted by programming of a first data signal that is coupled to a digital-to-analog converter. The programming causes the first data signal to be non-alterable. The programming is done during manufacturing of a wafer that includes the oscillator. A second data signal that is coupled from a microprocessor via a bus and via a second analog-to-digital converter to the oscillator can vary the oscillator free-running frequency to provide for tolerance compensation. The first data signal is immune against data errors. The second data signal is not immune against data errors, but can vary the oscillator frequency within only a relatively narrow range of values. Consequently, data errors are prevented from causing a significant change in the oscillator free-running frequency that might have occurred had both data signals been alterable.

9 Claims, 1 Drawing Sheet

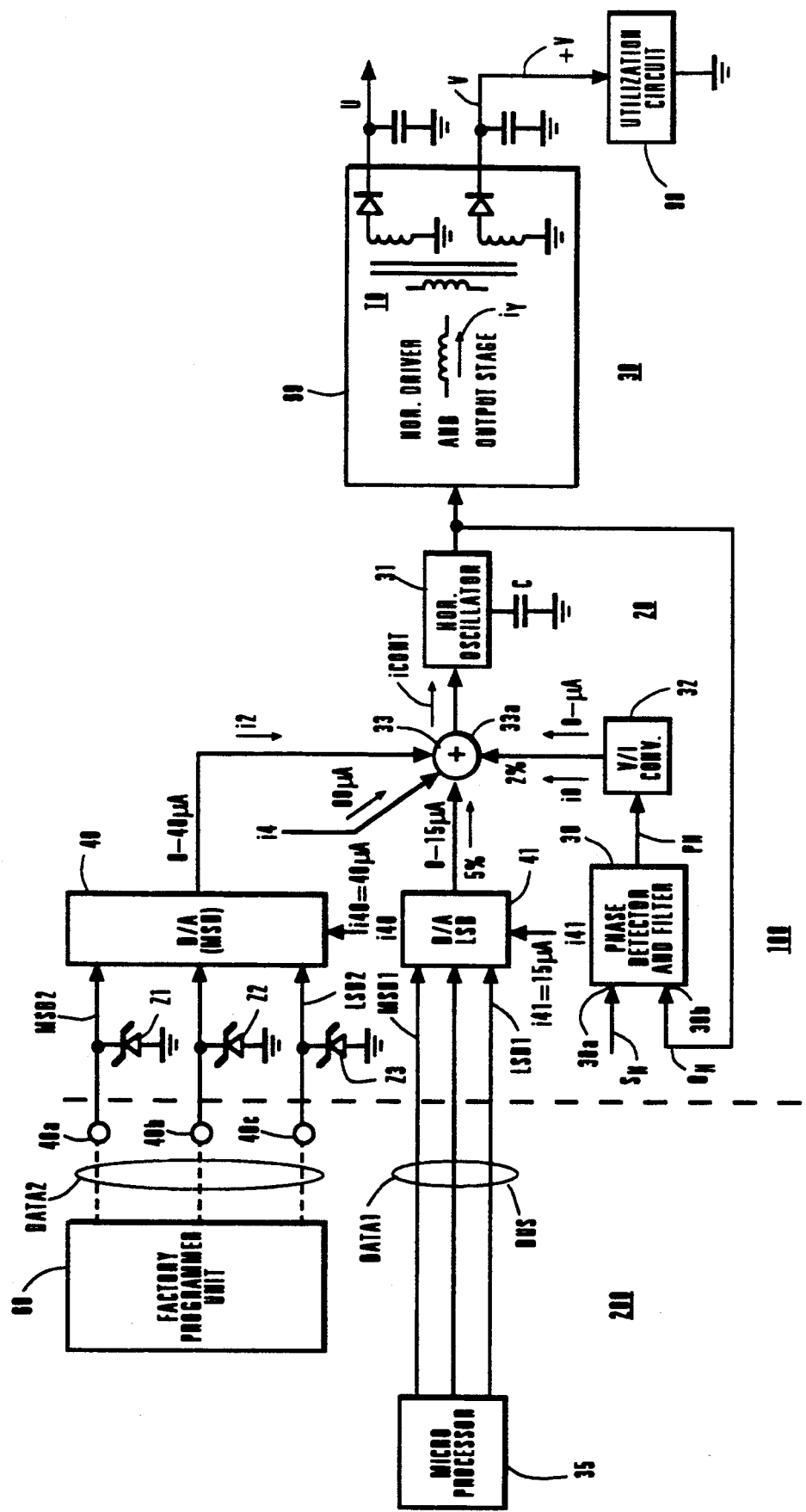

DATA SIGNAL CONTROLLED OSCILLATOR FOR A VIDEO DISPLAY

The invention relates to an oscillator of a video display apparatus having a frequency that is controlled by a data signal.

Television displays of television signals are generated by repetitively scanning an electron beam over the surface of a picture tube viewing screen. The beam intensity is modulated by video signals to form images on the screen representative of the picture to be displayed. In order to synchronize the scanning of the beam with the display information, the scanning or deflection circuits are synchronized with a synchronizing signal combined with the image information in a composite video signal. As received, the synchronizing signal may contain distortions in the from of electrical noise.

As transmitted, the synchronizing signal pulses recur at a rate which is stable. Because of the presence of noise it has become common practice to obtain synchronization of the horizontal deflection circuit with the horizontal synchronizing signal pulses by the use of a voltage controlled oscillator. The oscillator is controlled by and is included in a phase-lock loop (PLL). The oscillator generates a signal at a frequency that is equal to the frequency of the synchronizing signal frequency $f_H$ or its multiple. Because of the PLL operation, when, for example, one synchronizing pulse is obscured by noise, the rate of the oscillator, nevertheless, remains substantially unchanged, and the deflection circuits continue to receive regular deflection control pulses.

Typically, the free-running frequency of the oscillator is determined by a capacitance. Disadvantageously, the capacitor has a wide range of tolerance spread. Therefore, the oscillator free-running frequency may need to be adjusted to compensate for the wide range of tolerance spread. In one prior art arrangement, the oscillator frequency is adjusted according to data signal obtained via a bus from a microprocessor. A digital-to-analog (D/A) converter produces an analog signal at a level that is determined by the data signal for controlling the free-running frequency of the oscillator.

Typically, various power supply voltages for operating stages in the television receiver are produced from retrace pulse voltages produced in a horizontal flyback transformer. Such supply voltage is at a magnitude that is dependent on the frequency of the horizontal oscillator. Because in normal operation the horizontal oscillator frequency is constant, its effect on the supply voltage is predictable and is taken into account in the design of the power supply. However, should erroneous data signal be developed on the aforementioned bus, the horizontal frequency may become, for example, too low. Too low frequency could result in a destruction of a horizontal output transistor and/or in excessive supply voltages. Excessive supply voltages could harm the energized stages of the receiver. The erroneous data signal can occur as a result of malfunction of the microprocessor because of, for example, arcing. It may be desirable to adjust the free-running frequency of the oscillator over a wide range to compensate for the tolerance spread, during manufacturing, but to limit the frequency variation range of the oscillator, during normal operation. In this way, bit error on the bus is prevented from causing a potentially harm producing variation in the oscillator frequency.

A video display deflection, embodying an aspect of the invention, includes an oscillator for generating an output signal at a frequency related to a deflection frequency. A microprocessor develops a first data signal that is susceptible to being altered, when a fault condition occurs during operation in the microprocessor. A second data signal that cannot be altered via the microprocessor, during operation, is generated. A digital-to-analog converter having a first input responsive to the first data signal and a second input responsive to the second data signal generates an analog frequency control signal that is coupled to a control input of the oscillator to control a free-running frequency of the oscillator within a tolerance range. The free-running frequency of the oscillator is compensated partly in accordance with the first data signal and partly in accordance with the second data signal. A deflection circuit output stage is responsive to the oscillator output signal for generating a deflection current in a deflection winding.

The sole FIGURE illustrates a phase-lock-loop circuit, embodying the invention, that control the phase of a deflection current in a deflection winding.

Horizontal sync pulses $S_H$ at a frequency $f_H$, having a period H that in NTSC is 63.5 microseconds, are coupled, illustratively, from a conventional sync separator of a television receiver, not shown in the FIGURE, to an input terminal 30a of a phase detector 30. A signal $O_H$ that, during steady state operation, is at the frequency $f_H$ or its multiple is coupled to a second input terminal 30b of phase detector 30. A phase difference indicative signal PH that is indicative of the phase difference between signal $S_H$ and signal $O_H$ is generated by phase detector 30 and coupled via a voltage-to-current converter 32 that generates a current i0. Current i0 is coupled to an input terminal 33a of a current summing arrangement 33. Current summing arrangement 33 produces a sum current iCONT. Sum current iOUT is coupled to a frequency control input terminal 31a of a current controlled oscillator 31 to control its oscillation frequency. Oscillator 31 generates output signal $O_H$. Detector 30 and oscillator 31 form a phase-lock-loop circuit (PLL) 20 that may be included in a first integrated circuit (IC)100. The operation of PLL 20 causes signal $O_H$ to be synchronized with signal $S_H$.

A horizontal deflection circuit output stage 99 produces in a winding 34 of a flyback transformer T0 a retrace pulse at a high voltage that is used for generating an ultor voltage U. Voltage U is coupled to an ultor electrode of a cathode ray tube, not shown in the FIGURE, of the television receiver. A supply voltage V+ is generated in a similar manner and energizes a utilization circuit 98. A phase-controlled-loop, not shown, is used in such a way that a deflection current iy in a deflection winding Ly is maintained in a constant phase relationship relative to signal $O_H$ despite varying beam current loading that loads winding 34, in a well known manner. It may be desirable to prevent the frequency of oscillator 31 from becoming, for example, too low, to prevent harm to elements of stage 99 or of circuit 98.

The free-running frequency of oscillator 31 is determined, in part, by a capacitor C that is internal to IC 100 and that is produced using IC technology. Capacitor C is subject to wide range of spread values or tolerances. To partially compensate for the wide range of tolerances of capacitor C, a microprocessor 35 that is included in a separate, second IC 200 produces a 3-bit parallel binary data signal DATA1 on a bus BUS that is coupled to IC 100. Signal DATA1 is programmable, during operation.

A D/A converter 41 produces a D.C. current i1 that is coupled to summing arrangement 33 and summed there to form current iCONT. Current i1 varies in a range 0–15 µA, in accordance with signal DATA1. The maximum value of current i1 is determined by a reference current i41 of D/A converter 41. Current i1 is capable of varying the free-running frequency of oscillator 31 in a narrow range of, for example, 5% of the horizontal frequency $f_H$.

In accordance with an inventive feature, the range of adjustment of current i1 is narrower than ultimately used for tolerances compensation purposes. Because current i1 can vary the frequency of oscillator 31 only in the narrow range, an error in transmission on bus BUS, advantageously, cannot cause the aforementioned harm producing change in the frequency of oscillator 31.

A D/A converter 40, that may be located in IC 100, produces a current i2 that is coupled to arrangement 33. Current i2 is in a range of values of 0–40 µA that is determined by a reference current i40 of D/A converter 40. The sum of currents i2 and i1 that are included in current iCONT is capable of varying the free-running frequency of oscillator 31 in a wide range of values and with sufficient accuracy for tolerance compensation purposes.

In accordance with another inventive feature, a 3-bit binary input data signal DATA2 that is applied to D/A converter 40 is programmed in hardware in a non-alterable manner, prior to packaging a wafer that includes oscillator 31. The 3-bit signal DATA2 controls the magnitude of current i2. A least significant bit LSB2 of signal DATA2 has a greater contribution or weight with respect to current iCONT than a most significant bit MSB1 of signal DATA1.

The value of the three bits at terminals 40a, 40b and 40c of signal DATA2 are determined by the states of programmable elements Z1, Z2 and Z3 that are coupled to terminals 40a, 40b and 40c, respectively. Prior to the programming, each of elements Z1, Z2 and Z3 operates as a zener diode to produce a logical level "TRUE" at terminals 40a, 40b and 40c, respectively. Programming of a given element Z1, Z2 or Z3 establishes a logical level FALSE at the corresponding terminal 40a, 40b or 40c.

To determine which of elements Z1, Z1 or Z3 should be programmed, signal DATA1 is applied to D/A converter 41 at a value that produces current i1 equal to, for example, 7.5 µA, or mid-range value of its entire range, 0–15 µA. The 7.5 µA value of current i1 is obtained when the most significant bit of signal DATA1 is "TRUE" and the other two bits are at "FALSE". With current i1 at its mid-range value, zener diodes Z1, Z2 and Z3 are selected to be programmed such that current i2 causes a free-running frequency of oscillator 31 to be equal to the nominal frequency $f_H$.

When, for example, a logical level FALSE is required to be programmed at terminal 40a, a high level programming current produced in a factory programmer unit 60 is applied via a corresponding contact needle, not shown, that is bonded to terminal 40a. The programming current is applied prior to packaging a wafer that includes zener diodes Z1, Z2 and Z3, D/A converter 40 and oscillator 31. The current applied via the contact needle transforms permanently zener diode Z1 to a passive element acting as a short circuit. Thus, the logical level FALSE that is developed at terminal 40a is non-alterable, during operation. After the programming operation, the contact needles are withdrawn and are no longer bonded to the wafer. Then, the wafer that includes oscillator 31 is packaged into an IC package. During the packaging process, the wafer may be stressed mechanically. This can cause a change that is too large in the free-running frequency of oscillator 31.

In accordance with another inventive feature, to maintain at least 5-bit bit resolution from the combination of signals DATA1 and DATA2 over the entire tolerance range after the packaging, reference current i41 is selected to have a magnitude that enables signal DATA1 to compensate for the packaging process induced frequency change. The value of current i41 is such that most significant bit MSB1 has a greater weight than one-half the weight of least significant bit LSB2 of signal DATA2, with respect to current iCONT. In this way, the frequency tolerance range correction is, advantageously, maintained after the packaging of the wafer.

During operation, currents i0, i1, i2, i3 and a bias D.C. current i4 are summed to produce current iCONT. The effect of Data signal DATA1 on the free-running frequency of oscillator 31 that is controlled by current iCONT is only, for example, 5%. Advantageously, because data signal DATA2 is non-alterable and the effect of a data error in signal DATA1 is relatively small, a transmission error on bus BUS, cannot cause a significant change in the frequency of oscillator 31 that could harm stage 99 or circuit 98. Such harm might have occurred if signal DATA2 were also coupled from microprocessor 35 to D/A converter 40 via bus BUS and a transmission error occurred in data bits associated with D/A converter 40.

What is claimed is:

1. A video display deflection comprising:
   an oscillator for generating an output signal at a frequency related to a deflection frequency;
   a microprocessor for developing a first data signal that is susceptible to being altered during operation;
   a source of a second data signal that cannot be altered, during operation;
   a digital-to-analog converter having a first input responsive to said first data signal and a second input responsive to said second data signal for generating an analog, frequency control signal that is coupled to a control input of said oscillator to control a free-running frequency of said oscillator within a tolerance range, said free-running frequency of said oscillator being compensated partly in accordance with said first data signal and partly in accordance with said second data signal such that variation of said free running frequency via said second input is prevented by said second data signal being unalterable during operation; and
   a deflection circuit output stage responsive to said oscillator output signal for generating a deflection current in a deflection winding.

2. An apparatus according to claim 1 wherein said second data signal causes the free-running frequency of said oscillator to vary substantially less, when a fault condition occurs, than if said second data signal were susceptible to being altered via said microprocessor.

3. An apparatus according to claim 1 wherein said oscillator comprises a horizontal oscillator and said deflection circuit output stage comprises a horizontal deflection circuit output stage.

4. An apparatus according to claim 1 wherein said microprocessor develops said first data signal on a bus coupled to said digital-to-analog converter.

5. An apparatus according to claim 1 wherein said second data signal is developed by an operation of a passive element.

6. An apparatus according to claim 1 wherein said digital-to-analog converter comprises a first digital-to-analog converter portion that is responsive to said first data signal and a second digital-to-analog portion that is responsive to said second data signals to produce corresponding first and second portion signals that are combined to form said control signal.

7. A video display deflection apparatus comprising:
an oscillator for generating an output signal at a frequency related to a deflection frequency;
a microprocessor for developing a first data signal that is susceptible to being altered, when a fault condition occurs during operation in said microprocessor;
a source of a second data signal that cannot be altered via said microprocessor, during operation;
a digital-to-analog converter having a first input responsive to said first data signal and a second input responsive to said second data signal for generating an analog, frequency control signal that is coupled to a control input of said oscillator to control a free-running frequency of said oscillator within a tolerance range, said free-running frequency of said oscillator being compensated partly in accordance with said first data signal and partly in accordance with said second data signal wherein a least significant data bit of said second data signal has a weight, with respect to said control signal, that is larger than a most significant data bit of said first data signal and all the bits of said first data signal have a combined weight that is larger than the weight of the least significant bit of said second data signal; and
a deflection circuit output stage responsive to said oscillator output signal for generating a deflection current in a deflection winding.

8. A video display deflection apparatus comprising:
an oscillator for generating an output signal at a frequency related to a deflection frequency;
a microprocessor for developing a first data signal that is susceptible to being altered, when a fault condition occurs during operation in said microprocessor;
a source of a second data signal that cannot be altered via said microprocessor, during operation;
a digital-to-analog converter having a first input responsive to said first data signal and a second input responsive to said second data signal for generating an analog, frequency control signal that is coupled to a control input of said oscillator to control a free-running frequency of said oscillator within a tolerance range, said free-running frequency of said oscillator being compensated partly in accordance with said first data signal and partly in accordance with said second data signal wherein said oscillator is included in an integrated circuit and wherein said second data signal is programmable during the manufacturing of said integrated circuit and is non-alterable, afterwards; and
a deflection circuit output stage responsive to said oscillator output signal for generating a deflection current in a deflection winding.

9. An apparatus according to claim 1 wherein said oscillator is included in a phase-lock-loop circuit.

* * * * *